US010269477B2

(12) United States Patent
Matsutomi et al.

(10) Patent No.: US 10,269,477 B2
(45) Date of Patent: Apr. 23, 2019

(54) SOFT MAGNETIC RESIN COMPOSITION AND SOFT MAGNETIC FILM

(71) Applicant: NITTO DENKO CORPORATION, Osaka (JP)

(72) Inventors: Akihito Matsutomi, Osaka (JP); Takashi Habu, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 291 days.

(21) Appl. No.: 15/031,042

(22) PCT Filed: Sep. 4, 2014

(86) PCT No.: PCT/JP2014/073300
§ 371 (c)(1),
(2) Date: Apr. 21, 2016

(87) PCT Pub. No.: WO2015/060021
PCT Pub. Date: Apr. 30, 2015

(65) Prior Publication Data
US 2016/0268026 A1 Sep. 15, 2016

(30) Foreign Application Priority Data
Oct. 22, 2013 (JP) ................................. 2013-219282

(51) Int. Cl.
H01F 1/36 (2006.01)
H01F 1/26 (2006.01)
H05K 9/00 (2006.01)
H01F 1/37 (2006.01)

(52) U.S. Cl.
CPC ................ H01F 1/36 (2013.01); H01F 1/26 (2013.01); H01F 1/37 (2013.01); H05K 9/0075 (2013.01)

(58) Field of Classification Search
None
See application file for complete search history.

(56) References Cited

U.S. PATENT DOCUMENTS

| 6,527,972 | B1* | 3/2003 | Fuchs | B82Y 30/00 252/62.52 |
| 6,886,819 | B2* | 5/2005 | Kintz | C10M 171/001 188/267.2 |
| 2002/0097131 | A1* | 7/2002 | Kondo | H01F 3/10 336/212 |
| 2004/0109853 | A1* | 6/2004 | McDaniel | A62D 3/02 424/94.6 |
| 2005/0123743 | A1* | 6/2005 | Martinazzo | C09D 5/033 428/328 |
| 2006/0155020 | A1 | 7/2006 | Lenges et al. | |
| 2007/0003757 | A1 | 1/2007 | Yamamoto et al. | |
| 2011/0033732 | A1 | 2/2011 | Aramaki et al. | |
| 2012/0037223 | A1* | 2/2012 | Yamanaka | H01B 1/22 136/256 |
| 2013/0037094 | A1* | 2/2013 | Wang | H01B 1/22 136/256 |
| 2013/0112912 | A1 | 5/2013 | Wolfram et al. | |
| 2015/0235753 | A1* | 8/2015 | Chatani | H01F 27/245 336/200 |
| 2017/0107393 | A1* | 4/2017 | Shinke | C09D 125/14 |
| 2017/0110231 | A1* | 4/2017 | Matsutomi | H01F 10/18 |
| 2017/0271062 | A1* | 9/2017 | Furukawa | H01F 1/14791 |

FOREIGN PATENT DOCUMENTS

| CN | 101146873 A | 3/2008 |
| CN | 101946291 A | 1/2011 |
| EP | 2 466 597 A1 | 6/2012 |
| JP | 2007-008982 A | 1/2007 |
| JP | 2009-094298 A | 4/2009 |
| JP | 2009-242457 A | 10/2009 |
| JP | 2012-212790 A | 11/2012 |
| TW | 2009-40589 A | 10/2009 |
| WO | 2008/133172 A1 | 11/2008 |
| WO | 2011/117783 A2 | 9/2011 |

OTHER PUBLICATIONS

Office Action, issued by the State Intellectual Property Office of China (SIPO) dated Aug. 30, 2017, in connection with corresponding Chinese Patent Application No. 201480058412.9.
International Preliminary Report on Patentability issued by WIPO dated May 6, 2016, in connection with International Patent Application No. PCT/JP2014/073300.
International Search Report Issued in PCT/JP2014/073300 dated Dec. 16, 2014.
Written Opinion Issued in PCT/JP2014/073300 dated Dec. 16, 2014.
Extended European Search Report issued by the European Patent Office dated May 15, 2017, in connection with European Patent Application No. 14856532.8.
Office Action, issued by the Japanese Patent Office (JPO) dated Jul. 11, 2017, in connection with corresponding Japanese Patent Application No. 2013-219282.
Decision of Refusal dated Mar. 16, 2018 in connection with Japanese Patent Application No. 2013-219282.
Taiwanese Office Action dated Mar. 13, 2018 in connection with Taiwanese Patent Application No. 103131222.

* cited by examiner

Primary Examiner — Kevin M Bernatz
(74) Attorney, Agent, or Firm — Edwards Neils, LLC; Jean C. Edwards, Esq.

(57) ABSTRACT

A soft magnetic resin composition contains flat soft magnetic particles, a resin component, and a rheology control agent.

3 Claims, No Drawings

SOFT MAGNETIC RESIN COMPOSITION AND SOFT MAGNETIC FILM

CROSS-REFERENCE TO RELATED APPLICATIONS

The present application is a 35 U.S.C. 371 National Stage Entry of PCT/JP2014/073300, filed on Sep. 4, 2014, which claims priority from Japanese Patent Application No. 2013-219282, filed on Oct. 22, 2013, the contents of both of which are herein incorporated by reference in their entirety.

TECHNICAL FIELD

The present invention relates to a soft magnetic resin composition and a soft magnetic film.

BACKGROUND ART

A position detection device having a pen-type position indicator for detecting a position by moving the pen on a position detection plane is called a digitizer, and is widely spread as an input device for computers. The position detection device includes a position detection flat plate, and a circuit board (sensor board) disposed therebelow and having loop coils formed on the surface of the board. Then, the position of the position indicator is detected by using electromagnetic induction generated by the position indicator and loop coils.

Patent Document 1 has proposed, for example, a method in which a soft magnetic film containing a soft magnetic material is disposed at a face (opposite face) opposite to the face of the position detection plane of the sensor board in a position detection device for efficient communication by controlling the magnetic flux generated at the time of electromagnetic induction.

Patent Document 1 discloses a magnetic film containing a soft magnetic powder, a binder resin composed of, for example, acrylic rubber, phenol resin, epoxy resin, and melamine, and a metal salt of phosphinic acid. The soft magnetic film has a high content of, for example, a metal salt of phosphinic acid and melamine, and therefore, fire-retardancy is given to the circuit board without affecting reliability of an electronic device.

CITATION LIST

Patent Document

Patent Document 1: Japanese Unexamined Patent Publication No. 2012-212790

SUMMARY OF THE INVENTION

Problem to be Solved by the Invention

A soft magnetic film is generally produced by applying a soft magnetic resin composition solution (varnish) containing soft magnetic particles, a resin, and a solvent to a substrate or the like to be dried. However, in the varnish, heavy-weight soft magnetic particles precipitate and aggregate at the bottom thereof, so that stable application cannot be performed and as a result, film shaping (sheet shaping) (that is, film-forming) may not be performed.

Also, further improvement in magnetic properties such as relative magnetic permeability of the soft magnetic film is required.

It is an object of the present invention to provide a soft magnetic resin composition having excellent film-forming properties and having excellent magnetic properties at the time of being formed into a film, and a soft magnetic film formed from the soft magnetic resin composition.

Means for Solving the Problem

A soft magnetic resin composition of the present invention contains flat soft magnetic particles, a resin component, and a rheology control agent.

It is preferable that in the soft magnetic resin composition of the present invention, the rheology control agent is an organic rheology control agent.

It is preferable that in the soft magnetic resin composition of the present invention, the organic rheology control agent contains at least one kind selected from the group consisting of modified urea, urea-modified polyamide, and fatty acid amide.

It is preferable that the soft magnetic resin composition of the present invention further contains a dispersant.

A soft magnetic film of the present invention is formed by applying the above-described soft magnetic resin composition.

Effect of the Invention

The soft magnetic resin composition of the present invention contains the flat soft magnetic particles, the resin component, and the rheology control agent. Therefore, precipitation of the soft magnetic particles in the soft magnetic resin composition solution containing the soft magnetic resin composition of the present invention and a solvent can be reduced, and thus, stable application thereof to a release substrate can be performed and excellent film-forming properties can be achieved.

The soft magnetic film of the present invention is formed from the soft magnetic resin composition of the present invention, so that excellent magnetic properties of the soft magnetic film can be achieved.

DESCRIPTION OF EMBODIMENTS

A soft magnetic resin composition of the present invention contains flat soft magnetic particles, a resin component, and a rheology control agent.

Examples of the soft magnetic material that forms the soft magnetic particles include magnetic stainless steel (Fe—Cr—Al—Si alloy), Sendust (Fe—Si—Al alloy), permalloy (Fe—Ni alloy), silicon copper (Fe—Cu—Si alloy), Fe—Si alloy, Fe—Si—B (—Cu—Nb) alloy, Fe—Si—Cr—Ni alloy, Fe—Si—Cr alloy, Fe—Si—Al—Ni—Cr alloy, and ferrite. Among these, in view of magnetic properties, preferably, Sendust (Fe—Si—Al alloy) is used.

These soft magnetic particles can be used singly, or can be used in combination of two or more.

Among these, more preferably, a Fe—Si—Al alloy having a Si content of 9 to 15 mass % is used. In this manner, a real part of the magnetic permeability of the soft magnetic film can be increased.

The soft magnetic particles are preferably shaped flat (plate). The aspect ratio is, for example, 8 or more, preferably 15 or more, and for example, 80 or less, preferably 65 or less. The aspect ratio is calculated as an aspect ratio dividing the average particle size (average length) by an average thickness of the soft magnetic particles.

The soft magnetic particles have as average particle size (average length) of, for example, 3.5 μm or more, preferably 10 μm or more, and for example, 100 μm or less, preferably 80 μm or less. The average thickness is, for example, 0.3 μm or more, preferably 0.5 μm or more, and for example, 3.0 μm or less, preferably 2.5 μm or less. By adjusting the aspect ratio, average particle size, and average thickness of the soft magnetic particles, demagnetization effects of the soft magnetic particles can be reduced, and as a result, the relative magnetic permeability of the soft magnetic particles can be increased. To equalize the size of the soft magnetic particles, as necessary, those soft magnetic particles classified with, for example, a sieve can be used. The average particle size is measured with, for example, a laser diffraction particle size distribution analyzer (manufactured by Shimadzu Corporation, trade name "SALD-3100").

The soft magnetic particles have a specific gravity of, for example, 5.0 or more, preferably 6.0 or more, and for example, 10.0 or less, preferably 8.0 or less.

The soft magnetic particle content in the soft magnetic resin composition is, for example, 80 mass % or more, preferably 85 mass % or more, and for example, 95 mass % or less, preferably 92 mass % or less. The volume ratio of the soft magnetic particles in the soft magnetic resin composition is, for example, 40% by volume or more, preferably 55% by volume or more, and for example, 80% by volume or less, preferably 70% by volume or less. The soft magnetic particle content within the range of the above-described upper limit or less allows for excellent film-forming properties of the soft magnetic resin composition. Meanwhile, the soft magnetic particle content within the range of the above-described lower limit or more allows for excellent relative magnetic permeability of the soft magnetic film.

The resin component can contain any of a thermosetting resin and a thermoplastic resin, but preferably contains a thermosetting resin.

Examples of the thermosetting resin include epoxy resin, phenol resin, amino resin, unsaturated polyester resin, polyurethane resin, silicone resin, urea resin, melamine resin, thermosetting polyimide resin, and diallylphthalate resin. Preferably, epoxy resin and phenol resin are used, or more preferably, epoxy resin and phenol resin are used in combination.

For the epoxy resin, for example, those which can be used as an adhesive composition can be used, including bisphenol epoxy resin (particularly, bisphenol A epoxy resin, bisphenol F epoxy resin, bisphenol S epoxy resin, brominated bisphenol A epoxy resin, hydrogenated bisphenol A epoxy resin, bisphenol AF epoxy resin, etc.), phenol epoxy resin (particularly, phenol novolak epoxy resin, ortho-cresol novolak epoxy resin, etc.), biphenyl epoxy resin, naphthalene epoxy resin, fluorene epoxy resin, trishydroxyphenylmethane epoxy resin, and tetraphenylolethane epoxy resin. Furthermore, for example, hydantoin epoxy resin, trisglycidylisocyanurate epoxy resin, and glycidylamine epoxy resin can be also used. These can be used singly, or can be used in combination of two or more.

Of these examples of the epoxy resin, preferably, bisphenol epoxy resin is used, or more preferably, bisphenol A epoxy resin is used. Containing the epoxy resin allows for excellent reactivity with the phenol resin, and as a result, excellent heat resistance and excellent relative magnetic permeability of the soft magnetic film can be achieved.

The phenol resin is an epoxy resin curing agent, and for example, novolak phenol resins such as phenolnovolak resin, phenolaralkyl resin, cresol novolak resin, tert-butyl-phenolnovolak resin, and nonylphenolnovolak resin; resole phenol resin; and polyoxystyrenes such as polyparaoxystyrene are used. These can be used singly, or can be used in combination of two or more.

Of these phenol resins, preferably, novolak resin is used, more preferably, phenolnovolak resin and phenolaralkyl resin are used, or even more preferably, phenolaralkyl resin is used. Containing these phenol resins allows for improvement in connection reliability of a soft magnetic film laminated circuit board produced by laminating the soft magnetic film on a circuit board.

When the hydroxyl equivalent of the phenol resin relative to 100 g/eq of the epoxy equivalent of the epoxy resin is 1 g/eq or more and less than 100 g/eq, the epoxy resin content relative to 100 parts by mass of the resin component is, for example, 15 parts by mass or more, preferably 20 parts by mass or more, and for example, 70 parts by mass or less, preferably 50 parts by mass or less, and the phenol resin content relative to 100 parts by mass of the resin component is, for example, 5 parts by mass or more, preferably 15 parts by mass or more, and for example, 50 parts by mass or less, preferably 30 parts by mass or less.

When the hydroxyl equivalent of the phenol resin relative to 100 g/eq of the epoxy equivalent of the epoxy resin is 100 g/eq or more and less than 200 g/eq, the epoxy resin content relative to 100 parts by mass of the resin component is, for example, 10 parts by mass or more, preferably 25 parts by mass or more, and for example, 50 parts by mass or less, and the phenol resin content relative to 100 parts by mass of the resin component is, for example, 10 parts by mass or more, preferably 25 parts by mass or more, and for example, 50 parts by mass or less.

When the hydroxyl equivalent of the phenol resin relative to 100 g/eq of the epoxy equivalent of the epoxy resin is 200 g/eq or more and 1000 g/eq or less, the epoxy resin content relative to 100 parts by mass of the resin component is, for example, 5 parts by mass or more, preferably 15 parts by mass or more, and for example, 30 parts by mass or less, and the phenol resin content relative to 100 parts by mass of the resin component is, for example, 15 parts by mass or more, preferably 35 parts by mass or more, and for example, 70 parts by mass or less.

When two types of epoxy resins are used in combination, the epoxy equivalent is an epoxy equivalent of the total epoxy resins calculated by multiplying the epoxy equivalent of each of the epoxy resins by the mass ratio of each of the epoxy resins relative to the total amount of the epoxy resins, and adding these.

The hydroxyl equivalent of the phenol resin per 1 equivalent of the epoxy group of the epoxy resin is, for example, 0.2 equivalent or more, preferably 0.5 equivalent or more, and for example, 2.0 equivalent or less, preferably 1.2 equivalent or less. When the amount of the hydroxyl group is within the above-described range, curing reaction of the soft magnetic film in semi-cured state will be excellent, and deterioration can be suppressed.

The resin component has a thermosetting resin content relative to 100 parts by mass of the resin component of, for example, 20 parts by mass or more, preferably 30 parts by mass or more, and for example, 90 parts by mass or less, preferably 80 parts by mass or less, more preferably 60 parts by mass or less.

The resin component preferably contains, in addition to the thermosetting resin, acrylic resin. That is, in the resin component, acrylic resin, epoxy resin, and phenol resin are preferably used in combination. The resin component containing these resins in combination allows for excellent film-forming properties of the soft magnetic resin composition and excellent adhesiveness of the soft magnetic film in semi-cured state.

An example of the acrylic resin includes an acrylic polymer produced by polymerizing a monomer component of one, or two or more alkyl (meth)acrylates having a straight chain or branched alkyl group. The "(meth)acryl" represents "acryl and/or methacryl".

An example of the alkyl group includes an alkyl group having 1 to 20 carbon atoms such as methyl group, ethyl group, propyl group, isopropyl group, n-butyl group, t-butyl group, isobutyl group, amyl group, isoamyl group, hexyl group, heptyl group, cyclohexyl group, 2-ethylhexyl group, octyl group, isooctyl group, nonyl group, isononyl group, decyl group, isodecyl group, undecyl group, lauryl group, tridecyl group, tetradecyl group, stearyl group, octadecyl group, and dodecyl group. Preferably, an alkyl group having 1 to 6 carbon, atoms is used.

The acrylic polymer can be a copolymer of alkyl (meth) acrylate and an additional monomer.

Examples of the additional monomer include glycidyl group-containing monomers such as glycidyl acrylate and glycidyl methacrylate; carboxyl group-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic acid anhydride; hydroxyl group-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth) acrylate, 12-hydroxylauryl (meth)acrylate, and (4-(hydroxymethyl)cyclohexyl)methyl acrylate; sulfonic acid group-containing monomers such as styrenesulfonic acid, allylsufonic acid, 2-(meth) acrylamide-2-methylpropanesulfonic acid, (meth)acrylamidepropanesulfonic acid, sulfopropyl (meth)acrylate, and (meth)acryloyloxynaphthalenesulfonic acid; phosphoric acid group-containing monomers such as 2-hydroxyethylacryloyl phosphate; styrene monomer; and acrylonitrile.

Among these, preferably, a glycidyl group-containing monomer, a carboxyl group-containing monomer, or a hydroxyl group-containing monomer is used. When the acrylic resin is a copolymer of alkyl (meth)acrylate and an additional monomer of these, that is, when the acrylic resin contains a glycidyl group, a carboxyl group, or a hydroxyl group, excellent heat resistance of the soft magnetic film can be achieved.

When the acrylic resin is a copolymer of alkyl (meth) acrylate and an additional monomer, the additional monomer content (mass) relative to the copolymer is preferably 40 mass % or less.

The acrylic resin has a weight-average molecular weight of, for example, $1 \times 10^5$ or more, preferably $3 \times 10^5$ or more, and for example, $1 \times 10^6$ or less. The weight-average molecular weight of the acrylic resin within this range allows for excellent adhesiveness and heat resistance of the soft magnetic film. The weight-average molecular weight is measured based on polystyrene standard calibration value by Gel Permeation Chromatography (GPC).

The acrylic resin has a glass transition temperature (Tg) of for example, −30° C. or more, preferably −20° C. or more, and for example, 30° C. or less, preferably 15° C. or less. The acrylic resin with a glass transition temperature (Tg) of the above-described lower limit or more allows for excellent adhesiveness of the soft magnetic film in semi-cured state. Meanwhile, the acrylic resin with a glass transition temperature (Tg) of the above-described upper limit or less allows for excellent handleability of the soft magnetic film. The glass transition temperature is obtained by the maximum value of loss tangent (tan δ) measured by using a dynamic viscoelasticity measuring apparatus (DMA, frequency of 1 Hz, rising temperature rate of 10° C./min).

When the resin component contains acrylic resin, the acrylic resin content relative to 100 parts by mass of the resin component is, for example, 10 parts by mass or more, preferably 20 parts by mass or more, more preferably 40 parts by mass or more, and for example, 80 parts by mass or less, preferably 70 parts by mass or less. The acrylic resin content within this range allows for excellent film-forming properties of the soft magnetic resin composition and excellent adhesiveness of the soft magnetic film in semi-cured state.

In the resin component, the acrylic resin content relative to the epoxy resin content and the phenol resin content is more preferably excessive.

The resin component has a specific gravity of, for example, 0.8 or more, preferably 1.0 or more, and for example, 2.0 or less, preferably 1.5 or less.

The resin component can also contain a resin other than the thermosetting resin and the acrylic resin. An example of the resin other than the thermosetting resin and the acrylic resin includes a thermoplastic resin. These examples of the resin other than the thermosetting resin and the acrylic resin can be used singly, or can be used in combination of two or more.

Examples of the thermoplastic resin include natural rubber, butyl rubber, isoprene rubber, chloroprene rubber, ethylene-vinyl acetate copolymer, copolymer, polybutadiene resin, polycarbonate resin, thermoplastic polyimide resin, polyamide resin (6-nylon, 6,6-nylon, etc.), phenoxy resin, saturated polyester resin (PET, PBT, etc.), polyamide-imide resin, and fluorine resin.

The resin component content in the soft magnetic resin composition is, for example, 2 mass % or more, preferably 5 mass % or more, and for example, 50 mass % or less, preferably 20 mass % or less, more preferably 15 mass % or less. The resin component content within the above-described range allows for excellent film-forming properties of the soft magnetic resin composition.

The rheology control agent is a compound that imparts thixotropic properties of exhibiting high viscosity in the case of low shear force (shear rate) and exhibiting low viscosity in the case of high shear force (shear rate) to the soft magnetic resin composition.

Examples of the rheology control agent include an organic rheology control agent and an inorganic rheology control agent. Preferably, an organic rheology control agent is used.

Examples of the organic rheology control agent include modified urea, urea-modified polyamide, fatty acid amide, polyurethane, and polymer area derivative. Preferably, modified urea, urea-modified polyamide, and fatty acid amide are used, more preferably, modified area and urea-modified polyamide are used, or most preferably, modified urea is used.

The modified urea is a reaction product of an isocyanate monomer or an adduct product thereof with organic amine. The modified urea is preferably modified with polyoxyalkylene polyols such as polyoxyethylene polyol and polyoxypropylene polyol, an alkyd chain, or the like. The urea-modified polyamide is, for example, a compound having a urea bond and a compound in which a medium polar group or a low polar group is introduced to the end of the compound having the urea bond. Preferable examples of the medium polar group or the low polar group include polyoxyalkylene polyols such as polyoxyethylene polyol and polyoxypropylene polyol, and an alkyd chain. The fatty acid amide is a compound having a long chain fatty acid group and an amide group in the molecule.

The soft magnetic resin composition containing these allows for further reduction of the precipitation rate of the soft magnetic particles, and the film-forming properties of the soft magnetic resin composition are improved. Also, the soft magnetic particles can be further uniformly dispersed in the soft magnetic film, and the relative magnetic permeability of the soft magnetic film is improved.

Examples of the inorganic rheology control agent include silica, calcium carbonate, and smectite. Preferably, silica is used.

The rheology control agent may contain, in addition to the above-described compound (solid content), a solvent.

Examples of the solvent include organic solvents including protic high polar solvents such as ethanol, isopropyl alcohol, isobutyl alcohol, and monophenyl glycol; non-protic high polar solvents such as N-methyl-2-pyrrolidone, N-ethyl-2-pyrrolidone, and dimethyl sulfoxide; and low polar solvents such as solvent naphtha and alkylcyclohexane.

When the rheology control agent contains the solvent, the solid content thereof is, for example, 5 mass % or more, preferably 10 mass % or more, and for example, 70 mass % or less, preferably 60 mass % or less.

To be specific, examples of the rheology control agent include "BYK-410", "BYK-430", and "BYK-431" (manufactured by BYK Additives & Instruments); "DISPARLON PFA-131" (manufactured by Kusumoto Chemicals, Ltd.); and "AEROSIL VP NK200", "AEROSIL R976S", and "AEROSIL COK84" (manufactured by Nippon Aerosil Co., Ltd.).

These rheology control agents can be used singly, or can be used in combination of two or more.

The rheology control agent has a specific gravity of, for example, 0.5 or more, preferably 0.8 or more, more preferably 1.0 or more, and for example, 5.0 or less, preferably 3.0 or less, more preferably 2.0 or less. The specific gravity of the rheology control agent within this range allows for improvement of the relative magnetic permeability of the soft magnetic film.

The rheology control agent content in the soft magnetic resin composition is, for example, 0.05 mass % or more, preferably 0.1 mass % or more, and for example, 2 mass % or less, preferably 1 mass % or less. The rheology control agent content relative to 100 parts by mass of the soft magnetic particles is, for example, 0.05 parts by mass or more, preferably 0.1 parts by mass or more, and for example, 2 parts by mass or less, preferably 1 part by mass or less. The rheology control agent content within the above-described range allows for sufficient improvement of the film-forming properties of the soft magnetic resin composition and the relative magnetic permeability of the soft magnetic film.

The soft magnetic resin composition (and the soft magnetic film) preferably contains a dispersant.

Examples of the dispersant include polyether phosphate ester, a silane coupling agent, and a titanate coupling agent. Preferably, polyether phosphate ester is used. The soft magnetic resin composition containing these allows for absorption of the dispersant on the surfaces of the soft magnetic particles and improvement of the dispersibility of the soft magnetic particles, so that suppression of the precipitation of the soft magnetic particles by the rheology control agent is further effectively exhibited. As a result, the film-forming properties of the soft magnetic resin composition and the relative magnetic permeability of the soft magnetic film can be remarkably improved.

Examples of the polyether phosphate ester include polyoxyalkylene alkyl ether phosphate ester and polyoxyalkylene alkyl phenyl ether phosphate ester. Preferably, polyoxyalkylme alkyl ether phosphate ester is used.

The polyoxyalkylene alkyl ether phosphate ester has a structure in which one to three alkyl-oxy-poly(alkyleneoxy) groups are bonded to a phosphorus atom of phosphate. In the alkyl-oxy-poly(alkyleneoxy) group [that is, polyoxyalkylene alkyl ether portion], the number of repetition of alkyleneoxy related to the poly(alkyleneoxy) portion is not particularly limited, and can be appropriately selected from the range of 2 to 30 (preferably, 3 to 20). As the alkylene of the poly(alkyleneoxy) portion, preferably, an alkylene group having 2 to 4 carbon atoms is used. Specific examples thereof include an ethylene group, a propylene group, an isopropylene group, a butylene group, and an isobutyl group. The alkyl group is not particularly limited and preferably, an alkyl group having 6 to 30 carbon atoms is used, or more preferably, an alkyl group having 8 to 20 carbon atoms is used. Specific examples of the alkyl group include a decyl group, an undecyl group, a dodecyl group, a tridecyl group, a tetradecyl group, a pentadecyl group, a hexadecyl group, a heptadecyl group, and an octadecyl group. When the polyoxyalkylene alkyl ether phosphate ester has a plurality of alkyl-oxy-poly(alkyleneoxy) groups, the plurality of alkyl groups may be different or may be the same. The polyether phosphate ester may be a mixture with amine or the like.

The polyether phosphate ester has an acid value of, for example, 10 or more, preferably 15 or more, and for example, 200 or less, preferably 150 or less. The acid value is measured by a neutralization titration method or the like.

Examples of the silane coupling agent include 3-methacryloxypropyltrimethoxysilane and 2-(3,4-epoxycyclohexyl)ethyltrimethoxysilane.

These dispersants can be used singly, or can be used in combination of two or more.

Specific examples of the dispersant include the HIPLAAD series manufactured by Kusomoto Chemicals, Ltd. ("ED152", "ED153", "ED154", "ED118", "ED174", and "ED251") and the KBM series manufactured by Shin-Etsu Chemical Co., Ltd. ("KBM303" and "KBM503").

The dispersant has a specific gravity of, for example, 0.8 or more, preferably 1.0 or more, and for example, 2.0 or less, preferably 1.5 or less.

The dispersant content relative to 100 parts by mass of the soft magnetic particles is, for example, 0.05 parts by mass or more, preferably 0.1 parts by mass or more, and for example, 5 parts by mass or less, preferably 2 parts by mass or less.

The soft magnetic resin composition (and the soft magnetic film) preferably contains a thermosetting catalyst.

The thermosetting catalyst is not limited as long as the catalyst accelerates curing of the thermosetting resin by heating, and examples thereof include an imidazole compound, a triphenylphosphine compound, a triphenylborane compound, and an amino group-containing compound. Preferably, an imidazole compound is used.

Examples of the imidazole compound include 2-phenylimidazole (trade name; 2PZ), 2-ethyl-4-methylimidazole (trade name; 2E4MZ), 2-methylimidazole (trade name; 2MZ), 2-undecylimidazole (trade name; C11Z), 2-phenyl-4,5-dihydroxymethylimidazole (trade name; 2-PHZ), 2-phenyl-1H-imidazole 4,5-dimethanol (trade name; 2PHZ-PW), and 2,4-diamino-6-(2'-methylimidazolyl (1)') ethyl-s-triazine isocyanuric acid adduct (trade name; 2MAOK-PW) (the above-described products are all manufactured by Shikoku Chemicals Corporation).

The thermosetting catalyst has a shape of, for example, spherical or ellipsoidal.

These thermosetting catalysts can be used singly, or can be used in combination of two or more.

The thermosetting catalyst has a specific gravity of, for example, 0.8 or more, preferably 0.9 or more, and for example, 1.5 or less, preferably 1.4 or less.

The thermosetting catalyst content relative to 100 parts by mass of the resin component is, for example, 0.2 parts by mass or more, preferably 0.3 parts by mass or more, and for example, 5 parts by mass or less, preferably 2 parts by mass or less. When the thermosetting catalyst content is the above-described upper limit or less, the soft magnetic resin composition can achieve excellent storage stability for a long period of time under room temperature. Meanwhile, when the thermosetting catalyst content is the above-described lower limit or more, the soft magnetic film in semi-cured state can be heated and cured at a low temperature for a short period of time, and a soft magnetic film in cured state can be produced efficiently.

The soft magnetic resin composition can further contain, as necessary, an additional additive. Examples of the additive include a commercially available or known cross-linking agent and inorganic filler.

The soft magnetic resin composition can be prepared by mixing the above-described components at the above-described mixing ratio.

The soft magnetic film of the present invention is formed from the above-described soft magnetic resin composition.

To form the soft magnetic film, first, a soft magnetic resin composition solution (varnish) in which the above-described soft magnetic resin composition is dissolved or dispersed in a solvent is prepared.

Examples of the solvent include organic solvents including ketones such as acetone and methyl ethyl ketone (MEK); esters such as ethyl acetate; and amides such as N,N-dimethylformamide. Examples of the solvent also include water-based solvents such as water, and alcohols such as methanol, ethanol, propanol, and isopropanol.

The soft magnetic resin composition solution has a solid content of, for example, 30 mass % or more, preferably 38 mass % or more, more preferably 41 mass % or more, and for example, 60 mass % or less, preferably 47 mass % ox less, more preferably 45 mass % or less.

The precipitation rate of the soft magnetic particles in the soft magnetic resin composition solution at this time is, for example, 1 µm/sec or more, preferably 10 µm/sec or more, more preferably 20 µm/sec or more, and for example, 150 µm/sec or less, preferably 100 µm/sec or less, more preferably 50 µm/sec or less. The precipitation rate of the soft magnetic particles within this range allows for stable application of the soft magnetic resin composition solution to a release substrate and excellent film-forming properties.

The precipitation rate of the soft magnetic particles are measured using a dispersion and stability analyzer (manufactured by LUM GmbH, trade name "LUMiFuge116") under the conditions of measurement points of 50, an interval of 10 seconds, and a rotational rate of 3000 rpm.

Next, the soft magnetic resin composition solution is applied to the surface of the release substrate, thereby forming a coated film.

The application method is not particularly limited, and for example, doctor blades, roll coating, screen coating, and gravure coating can be used.

Examples of the release substrate include a separator and a core material.

Examples of the separator include a polyethylene terephthalate (PET) film, a polyethylene film, a polypropylene film, and paper. The surfaces of these examples of the separator are preferably subjected to release treatment with, for example, a fluorine release agent, a long-chain alkylacrylate release agent, and a silicone release agent.

Examples of the core material include a plastic film (e.g., polyimide film, polyester film, polyethylene terephthalate film, polyethylenenaphthalate film, polycarbonate film, etc.), a metal film (e.g., aluminum foil etc.), and a resin substrate, a silicon substrate, and a glass substrate reinforced with, for example, glass fiber and plastic nonwoven fiber.

The separator or the core material has an average thickness of, for example, 1 µm or more and 500 µm or less.

Next, the coated film is dried under predetermined conditions. In this manner, the soft magnetic film in semi-cured state is produced.

Examples of drying conditions include a drying temperature of, for example, 70° C. or more and 160° C. or less, and drying time of, for example, 1 minute or more and 5 minutes or less.

The soft magnetic film is in semi-cured state (B-stage state) under room temperature (to be specific, at 25° C.) and is a soft magnetic adhesive film having excellent adhesiveness.

The soft magnetic film (semi-cured state) has a film thickness of, for example, 5 µm or more, preferably 50 µm or more, and for example, 500 µm or less, preferably 300 µm or less.

Next, the soft magnetic film in semi-cured state is hot pressed in a thickness direction. In this manner, the soft magnetic film in cured state (C-stage state) is produced.

Hot pressing can be performed using a known pressing machine. An example thereof includes a parallel flat plate pressing machine.

The heating temperature is, for example, 80° C. or more, preferably 100° C. or more, and for example, 200° C. or less, preferably 180° C. or less.

The healing time is, for example, 0.1 hours or more, preferably, 0.2 hours or more, and for example, 24 hours or less, preferably 3 hours or less.

The degree of vacuum is, for example, 5000 Pa or less, preferably 2000 Pa or less.

The pressure is, for example, 1 kN/cm$^2$ or more, preferably 10 kN/cm$^2$ or more, and for example, 200 kN/cm$^2$ or less, preferably 100 kN/cm$^2$ or less. In this manner, the relative magnetic permeability of the soft magnetic film and a thinner soft magnetic film can be improved.

A plurality of soft magnetic films may be laminated and hot pressed as necessary. At this time, the number of lamination of the soft magnetic film (semi-cured state) is, for example, 2 layers or more, and for example, 20 layers or less, preferably 5 layers or less. In this manner, the soft magnetic film can be adjusted to have a desired thickness.

The soft magnetic film has a film thickness of, for example, 5 µm or more, preferably 50 µm or more, and for example, 500 µm or less, preferably 250 µm or less.

The filling rate of the soft magnetic particles (volume percentage, excluding gaps, of the soft magnetic particles accounting for the solid content in the soft magnetic film) relative to the solid content of the soft magnetic film is, for example, 50% by volume or more, preferably 55% by volume or more, and for example, 95% by volume or less, preferably 90% by volume or less. This allows for excellent relative magnetic permeability of the soft magnetic film.

In the soft magnetic film, the soft magnetic particles contained in the soft magnetic film are preferably arranged in a 2-dementional in-plane direction of the soft magnetic film. That is, a longitudinal direction (direction perpendicular to thickness direction) of the flat soft magnetic particles is oriented to be along a surface direction of the soft magnetic film. Thus, the soft magnetic film has further excellent relative magnetic permeability.

The soft, magnetic film has a relative magnetic permeability of, for example, 195 or more, preferably 200 or more, more preferably 210 or more, and for example, 400 or less.

The soft magnetic film can be, for example, a single layer structure composed only of a single layer of the soft magnetic film, a multiple layer structure in which the soft magnetic film is laminated on one side or both sides of the core material, or a multiple layer structure in which a separator is laminated on one side or both sides of the soft magnetic film.

Furthermore, although the soft magnetic film in semi-cured state is hot pressed in the above-described embodiment, the hot pressing does not have to be performed. That is, the soft magnetic film can be used as it is in semi-cured state. The surface of the soft magnetic film in semi-cured state is adhesive, and therefore, can be directly laminated on a circuit board, for example, without using an adhesive. Thereafter, as necessary, curing can be performed to produce a soft magnetic film in cured state.

The soft magnetic film can be widely used for various industrial intended uses. The soft magnetic film can be preferably used as, for example, an electromagnetic wave absorption film and as a soft magnetic film for circuit boards to be laminated on an antenna, a coil, or a circuit board having these formed on the surface thereof. The soft magnetic film can be used as a soft magnetic film for circuit boards, to be more specific, for intended uses such as smartphones, personal computers, and position detection devices (digitizers).

Examples of a method for laminating the soft magnetic film on the circuit board include a method in which the soft magnetic film in cured state is fixed to the circuit board via an adhesive layer and a method in which after the soft magnetic film in semi-cured state is directly attached to the circuit board, the adhesive film is cured by heating to be fixed to the circuit board.

In view of unnecessity of an adhesive layer and miniaturization of an electronic device, a method in which after the soft magnetic film in semi-cured state is directly attached to the circuit board, the soft magnetic film is cured by heating is used.

In view of further securing insulation properties, a method in which the soft magnetic film in cured state is fixed to the circuit board via an adhesive layer is used.

As the adhesive layer, a known adhesive layer usually used as an adhesive layer of a circuit board is used. The adhesive layer is, for example, formed by applying adhesives such as an epoxy adhesive, a polyimide adhesive, and an acrylic adhesive to be dried. The adhesive layer has a thickness of, for example, 10 to 100 μm.

The soft magnetic resin composition contains the flat soft magnetic particles, the resin component, and the rheology control agent, so that precipitation of the soft magnetic particles in the soft magnetic resin composition solution containing the soft magnetic resin composition and the solvent can be reduced. As a result, stable application of the soft magnetic resin composition solution to the release substrate can be performed and excellent film-forming properties can be achieved.

The soft magnetic film is formed from the soft magnetic resin composition, so that the soft magnetic particles can be uniformly and surely dispersed to be present in the soft magnetic film. As a result, the relative magnetic permeability of the soft magnetic film is excellent.

According to the soft magnetic film, the soft magnetic particles are flat and arranged in the 2-dimensional in-plane direction of the soft magnetic film, so that the soft magnetic particles fill at high density and a thinner soft magnetic film can be achieved.

EXAMPLES

While in the following, the present invention is described in further detail with reference to Examples and Comparative Examples, the present invention is not limited to any of them by no means. The numeral values in Examples shown below can be replaced with the numeral values shown in the above-described embodiments (that is, upper limit value or lower limit value).

Example 1

A soft magnetic resin composition was produced by mixing 500 parts by mass of soft magnetic particles, 24 parts by mass of an acrylate ester polymer, 10 parts by mass of bisphenol A epoxy resin (1), 4 parts by mass of bisphenol A epoxy resin (2), 15 parts by mass of phenol aralkyl resin, 0.52 parts by mass of 2-phenyl-1H-imidazole 4,5-dimethanol (thermosetting catalyst), 0.5 parts by mass of polyether phosphate ester (dispersant), and 1.1 parts by mass of a rheology control agent (manufactured by BYK Additives & Instruments, "BYK-410") so that the soft magnetic particles were 60% by volume relative to the soft magnetic resin composition.

Examples 2 to 4

Soft magnetic resin compositions were produced in the same manner as in Example 1, except that the mixing of the rheology control agent was changed to that shown in Table 1.

Comparative Example 1

A soft magnetic resin composition was produced in the same manner as in Example 1, except that the rheology control agent was not blended in Example 1.

Comparative Example 2

A soft magnetic resin composition was produced in the same manner as in Example 1, except that the rheology control agent and the dispersant were not blended in Example 1.

(Precipitation Rate of Soft Magnetic Particles)

Each of the soft magnetic resin compositions in Examples and Comparative Examples was dissolved in methyl ethyl ketone, thereby producing a soft magnetic resin composition solution having a solid content concentration of 43 mass %.

Then, 2 ml of the soft magnetic resin composition solution was put in a glass cell to be measured using a dispersion and stability analyzer (manufactured by LUM GmbH, trade name "LUMiFuge116") under the conditions of measurement points of 50, an interval of 10 seconds, and a rotational rate of 3000 rpm. The results are shown in Table 1.

(Film-Forming Properties)

Each of the soft magnetic resin compositions in Examples and Comparative Examples was dissolved in methyl ethyl ketone, thereby producing a soft magnetic resin composition solution having a solid content concentration of 43 mass %.

The soft magnetic resin composition solution was applied onto a separator (average thickness of 50 μm) composed of a polyethylene terephthalate film subjected to silicone release treatment with an applicator, thereby forming a coated film. Thereafter, the coated film was dried under the conditions of 130° C. for 2 minutes, thereby producing a soft magnetic film in semi-cured state.

At this time, a case where the soft magnetic resin composition solution was capable of being stably applied to the separator and roughness was not confirmed on the surface of the produced soft magnetic film in semi-cured state was evaluated as "Excellent". A case where the soft magnetic resin composition solution was capable of being stably applied to the separator, but roughness was confirmed on the surface of the produced soft magnetic film in semi-cured state was evaluated as "Good". A case where the soft magnetic resin composition solution was not capable of being stably applied to the separator and film-forming was not achieved was evaluated as "Bad". The results are shown in Table 1.

(Magnetic Properties)

Each of the soft magnetic resin compositions in Examples and Comparative Examples was dissolved in methyl ethyl ketone, thereby producing a soft magnetic resin composition solution having a solid content concentration of 43 mass %.

The soft magnetic resin composition solution was applied onto a separator (average thickness of 50 μm) composed of a polyethylene terephthalate film subjected to silicone release treatment with an applicator, thereby forming a coated film. Thereafter, the coated film was dried under the conditions of 130° C. for 2 minutes, thereby producing a soft magnetic film in semi-cured state.

Next, the soft magnetic film in semi-cured state was hot pressed with a vacuum hot pressing device (manufactured by Mikado Technos Co., Ltd.) under the conditions of a vacuum (1000 Pa), a temperature of 175° C., and a pressure of 40 kN/cm$^2$ for 30 minutes, thereby producing a soft magnetic film in cured state.

The relative magnetic permeability μ of the produced soft magnetic film was measured by a one turn method (frequency of 1 MHz) using an impedance analyzer (manufactured by Agilent Technologies, "4294A"). The results are shown, in Table 1.

The details of the components used in Examples and Comparative Examples are described below.

Fe—Si—Al alloy: trade same "SP-7", soft magnetic particles, flat, average particle size of 65 μm, manufactured by Mate Co., Ltd., specific gravity of 6.8

Acrylate ester polymer: trade name "Paracron W-197CM", acrylate ester polymer mainly composed of ethyl acrylate-methyl methacrylate, manufactured by Negami Chemical Industrial Co., Ltd., specific gravity of 1.0

Bisphenol A epoxy resin (1): trade name "Epikote 1004", epoxy equivalent of 875 to 975 g/eq, manufactured by JER, specific gravity of 1.21

Bisphenol A epoxy resin (2): trade name "Epikote YL980", epoxy equivalent of 180 to 190 g/eq, manufactured by JER, specific gravity of 1.15

Phenolaralkyl resin: trade name, "MILEX XLC-4L", hydroxyl equivalent of 170 g/eq, manufactured by Mitsui Chemicals, Inc., specific gravity of 1.18

2-phenyl-1H-imidazole 4,5-dimethanol: thermosetting catalyst, trade name "CUREZOL 2-PHZ-PW", manufactured by Shikoku Chemicals Corporation, specific gravity of 1.33

Polyether phosphate ester: dispersant, trade name "HIP-LAAD ED152", manufactured by Kusumoto Chemicals, Ltd., acid value of 17, specific gravity of 1.03

BYK-410: trade name, organic rheology control agent, mixture of modified urea and N-methyl-2-pyrrolidone, solid content of 52 mass %, manufactured by BYK Additives & Instruments, specific gravity of 1.13

BYK-430: trade name, organic rheology control agent, mixture of urea-modified medium polar polyamide, isobutyl alcohol and solvent naphtha, solid content of 30 mass %, manufactured by BYK Additives & Instruments, specific gravity of 0.86

PFA-131: trade name "DISPARLON PFA-131", organic rheology control agent, mixture of fatty acid amide wax, alkyl cyclohexane, ethanol and isopropyl alcohol, solid content of 10 mass %, manufactured by Kusumoto Chemicals, Ltd., specific gravity of 0.82

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICABILITY

The soft magnetic film of the present invention can be used for various industrial intended uses and, for example,

TABLE 1

| | | | Ex. 1 | Ex. 2 | Ex. 3 | Ex. 4 | Comp. Ex. 1 | Comp. Ex. 2 |
|---|---|---|---|---|---|---|---|---|
| Organic Rheology Control Agent (parts by mass) | BYK-410 | Modified Urea | 1.1 | — | — | — | — | — |
| | BYK-430 | Urea-Modified Medium Poly Polyamide | — | 1.1 | — | 1.1 | — | — |
| | PFA-131 | Fatty Acid Amide | — | — | 1.0 | — | — | — |
| Dispersant (parts by mass) | Polyether Phosphates Ester | | 0.5 | 0.5 | 0.5 | — | 0.5 | — |
| Precipitation Rate (μm/sec) | | | 26.7 | 66.2 | 88.4 | 66.6 | 168.4 | 167.1 |
| Film-Forming Properties | | | Excellent | Excellent | Excellent | Good | Bad | Bad |
| Relative Magnetic Permeability μ | | | 216.6 | 213.9 | 201.3 | 197.9 | 190.7 | 189.7 | can be preferably used as an electromagnetic wave absorption film, a soft magnetic film for circuit boards.

The invention claimed is:

1. A soft magnetic resin composition comprising:
   flat soft magnetic particles, a resin component, a dispersant, and a rheology control agent, wherein the dispersant content relative to 100 parts by mass of the soft magnetic particles is 0.05 parts by mass or more and 5 parts by mass or less and the rheology control agent content relative to 100 parts by mass of the soft magnetic particles is 0.05 parts by mass or more and 2 parts by mass or less,
   wherein the soft magnetic particles have an aspect ratio of 8 or more and 80 or less, and
   wherein the rheology control agent contains at least one kind selected from the group consisting of modified urea and urea-modified polyamide,
   where the modified urea is modified with a polyoxyalkylene polyol or an alkyd chain, and
   where the urea-modified polyamide includes a compound having a urea bond and a compound having a polar group, wherein the compound having the polar group is bonded to the end of the compound having the urea bond.

2. The soft magnetic resin composition according to claim 1, wherein the dispersant contains at least one kind selected from the group consisting of polyether phosphate ester, a silane coupling agent, and a titanate coupling agent.

3. A soft magnetic film formed by applying a soft magnetic resin composition comprising:
   flat soft magnetic particles, a resin component, a dispersant, and a rheology control agent, wherein the dispersant content relative to 100 parts by mass of the soft magnetic particles is 0.05 parts by mass or more and 5 parts by mass or less and the rheology control agent content relative to 100 parts by mass of the soft magnetic particles is 0.05 parts by mass or more and 2 parts by mass or less,
   wherein the soft magnetic particles have an aspect ratio of 8 or more and 80 or less, and
   wherein the rheology control agent contains at least one kind selected from the group consisting of modified urea and urea-modified polyamide,
   where the modified urea is modified with a polyoxyalkylene polyol or an alkyd chain, and
   where the urea-modified polyamide includes a compound having a urea bond and a compound having a polar group, wherein the compound having the polar group is bonded to the end of the compound having the urea bond.

* * * * *